United States Patent [19]

Evans, Jr.

[11] 4,360,701
[45] Nov. 23, 1982

[54] HEAT TRANSPARENT HIGH INTENSITY HIGH EFFICIENCY SOLAR CELL

[75] Inventor: John C. Evans, Jr., Ravenna, Ohio

[73] Assignee: The United States of America as represented by the Administrator of the National Aeronautics and Space Administration, Washington, D.C.

[21] Appl. No.: 264,380

[22] Filed: May 15, 1981

[51] Int. Cl.³ ............................................. H01L 31/06
[52] U.S. Cl. ................................ 136/259; 136/255; 136/256
[58] Field of Search ............... 136/246, 255, 256, 259; 357/30

[56] References Cited

U.S. PATENT DOCUMENTS

| | | | |
|---|---|---|---|
| 2,206,196 | 7/1940 | Kubitzek | 136/259 X |
| 2,320,185 | 5/1943 | Lamb | 136/256 |
| 3,015,590 | 1/1962 | Fuller | 148/1.5 |
| 3,150,999 | 9/1964 | Rudenberg et al. | 136/256 |
| 3,152,926 | 10/1964 | Power | 136/246 |
| 3,419,434 | 12/1968 | Colehower | 136/246 |
| 3,490,950 | 1/1970 | Myer | 136/246 |
| 3,948,682 | 4/1976 | Bordina et al. | 136/244 |
| 3,973,994 | 8/1976 | Redfield | 136/259 |
| 3,994,012 | 11/1976 | Warner, Jr. | 136/246 |
| 4,046,594 | 9/1977 | Tarui et al. | 136/244 |
| 4,072,541 | 2/1978 | Meulenberg, Jr. et al. | 136/255 |
| 4,082,570 | 4/1978 | House et al. | 136/246 |
| 4,128,732 | 12/1978 | Kaplow et al. | 136/246 |
| 4,135,950 | 1/1979 | Rittner | 136/255 |
| 4,174,978 | 11/1979 | Lidorenko et al. | 136/246 |
| 4,227,942 | 10/1980 | Hall | 136/255 |
| 4,295,002 | 10/1981 | Chappell et al. | 136/244 |

FOREIGN PATENT DOCUMENTS

52-57792 12/1977 Japan .................................. 136/255
1028417 5/1966 United Kingdom ................ 136/256

Primary Examiner—Aaron Weisstuch
Attorney, Agent, or Firm—Norman T. Musial; John R. Manning; Gene E. Shook

[57] ABSTRACT

A heat transparent high intensity solar cell has improved efficiency.

A surface of each solar cell (10,16,22) has a plurality of grooves (12,14,18,20,24). Each groove has a vertical face (26,30) and a slanted face (28,32) that is covered by a reflecting metal (34,36).

Light rays (38,40) are reflected from the slanted face through the vertical face where they traverse a photovoltaic junction (60). As the light rays travel to the slanted face of an adjacent groove, they again traverse the junction. The underside of the reflecting coating directs the light rays toward the opposite surface of solar cell as they traverse the junction again. When the light rays travel through the solar cell and reach the saw toothed grooves on the under side, the process of reflection and repeatedly traversing the junction again takes place. The light rays ultimately emerge from the solar cell as shown in FIG. 4.

These solar cells are particularly useful at very high levels of insolation because the infrared or heat radiation passes through the cells without being appreciably absorbed to heat the cell.

17 Claims, 7 Drawing Figures

HEAT TRANSPARENT HIGH INTENSITY HIGH EFFICIENCY SOLAR CELL

ORIGIN OF THE INVENTION

The invention described herein was made by an employee of the United States Government and may be manufactured and used by or for the Government for governmental purposes without the payment of any royalties thereon or therefor.

TECHNICAL FIELD

This invention is concerned with improving photovoltaic devices. The invention is particularly directed to an improved solar cell.

Theoretical considerations show that the maximum solar energy conversion efficiency of a semiconductor material is dependent on the bandgap of the material, and it can be defined in terms of open-circuit voltage, short circuit current, and the fill factor. The fill factor is the ratio of the maximum power output of the solar cell to the product of the first two measurements. The maximum power is the maxima product of the voltage and current values. Their product is a rectangle having the maximum area or power that can be drawn under a standard voltage-current curve derived by the loading of an illuminated solar cell subjected to varying load resistance under test.

It is possible to express analytically the ideal solar cell having maximum efficiency of conversion for any given material. This means that the fill factor will shift toward the upper right hand corner of the voltage current curve which, in effect, squares the current voltage curve. A quantity known as the "limit conversion efficiency" has been calculated for most solar cell materials by making certain assumptions.

These assumptions are (1) total absorption of all photons with energies greater than the bandgap, (2) total collection of all generated carriers, (3) negligible series and shunt solar cell resistance losses, (4) negligible contact area known as shadowing of the active surface, and (5) negligible light reflection.

Values of the "limit conversion efficiency" for silicon solar cells with a bandgap of 1.12 electron volts are 18% at air mass zero and 20% of the air mass two. These terms refer to the length of the light path within the atmosphere when traveling from the sun to the solar cell, and they are measures of attenuation. The present invention has a beneficial technical effect on each of these five efficiency determiners.

PRIOR ART

Warner U.S. Pat. No. 3,994,012 describes a bottom-reflective angled surface which causes light to be returned through the cell body and to possibly traverse the active junction region a second or more time. The concept of having the light internally deflected or reflected and rejected out the entering surface is well known in the art. Such back reflectors do not positively allow the infrared or heating energies to leave the body of the solar cell.

Muelenberg et al U.S. Pat. No. 4,072,541 is directed to a back reflector solar cell with a "fine geometry" type front contact and a full coverage metal back contact. U.S. Pat. No. 4,041,594 to Tarui et al shows a configuration exposing small portions of numerous series connected solar cell junctions.

DISCLOSURE OF INVENTION

The length of the light path within the lattice of the solar cell is increased by causing multiple passes or internal reflections within the cell. At least one surface of the solar cell is grooved, and selected portions are silvered to provide for the reflections.

Such a structure benefits the five efficiency determiners or assumptions listed above which are made to determine the limit conversion efficiency. More particularly, light absorption within the structure of the solar cell is determined, in part, by the length of the light path within the lattice of the solar cell. This path is increased by causing multiple passes or internal reflections to occur. If absorption occurs within the immediate region of the semiconductor junction or p-n interface, the carriers which are formed by this photon absorption are ideally situated in an electric field region. Being free charges, these carriers will migrate toward the collection surfaces and thus to the external circuit.

The carrier collection is fundamentally determined by the ability of the charges produced to reach a collection surface before recombination occurs. This is generally a property of the semiconductor material as well as its physical and chemical constitution. Many things can cause recombination to occur. Defects in the structure, such as those named for Frenkel or Schottky as well as impurity elements, may act as recombination sites. Distortions or damage to the lattice can create regions of electrical field concentrations which cause recombination. The doping level is a determiner of the property known as lifetime which is a measure of the time a carrier may travel in the semiconductor before, on the average, it recombines to form a neutral atom or molecule. The absorption of a photon is a pumping mechanism which elevates an electron to a higher energy position enabling it to travel freely through the lattice, i.e. conduction band from the valence band. Upon recombination, the energy of pumping is yielded up to the lattice as heat or phonon motion. Such disturbances do no useful work electrically in the external circuit.

A solar cell constructed in accordance with the present invention has a structure such that the greatest distance any charge will have to travel is one-half the distance of the groove depth to reach a metal collection surface. Most of the charges will travel the junction distance, which may be from one-tenth of a micrometer to two micrometers. This close spacing of the collectors and the general coverage of much of the collection surface makes lifetime of the semiconductor less important; thus higher doping with the consequent lower lifetimes is possible.

Another advantage of the solar cell of the present invention is the greatly reduced loss of photogenerated minority carriers at the surface of the solar cell due to the presence of surface states which arise from unsatisfied or dangling bonds, chemical residues, metal precipitates, oxides, etc. The surface is generally covered with collector material in the proximity of the junction, and surface state problems are greatly reduced. It is generally accepted that the surface recombination velocity is of very great importance in a solar cell inasmuch as the number of carriers generated for a given wavelength of light is highest at the very surface and decreases exponentially with distance into the cell. The combination of a shallow junction with a completely covering metal collector avoids most of this cause of loss.

The series and shunt resistance losses are negligible in the solar cells of the present invention. The theoretical series resistances of both n on p and p on n solar cells of silicon have been calculated. It was found that theoretically the best value for the space-type phosphorous diffused n on p cell is 0.73 ohms and the p on n cell is 0.43 ohms. It is calculated the bulk resistance has a value of 0.02 ohms and a bottom electrode to bulk resistance of 0.08 ohms. Thus, the solar cell of the present invention should have a maximum series resistance of 0.2 ohms or less depending upon the bulk resistivity chosen.

The shunt resistance of a solar cell is the internal resistance which acts electrically in parallel with the junction and is a parasitic loss mechanism. It is, therefore, desirable to have this value as high as possible so that current loss will be minimized. A 14% efficient silicon solar cell will normally exhibit a shunt resistance greater than 300 ohms and may reach $10^3$ ohms. These shunt resistances are thought to be caused by surface leakage along the edges of the cell, by diffusion spikes along dislocations or grain boundaries or possibly by fine metallic bridges along microcracks, grain boundaries, or crystal defect planes after metallization has been applied. Care with the lattice during processing, surface passivation and improved metallization have all served to reduce these causes of loss.

Negligible contact areas are desired because contacts on current silicon solar cells may obscure or shadow from 5% to 10% of the active surface for photon absorption. The present solar cell structure is novel inasmuch as it presents a totally uncovered surface area to the entering light. For the sunlight approaching normally to the plane of the solar cell, an area equivalent to the surface dimensions is illuminated. The solar cell of the present invention has a 100% contact coverage while being 100% transparent or unobscured at the surface containing junction regions.

Negligible light reflection is achieved in present day cells by either producing a textured light-trapping totally internally reflecting surface of etched pyramids or coating the surface with a material to match the respective indices of refraction of the two media; atmosphere and silicon. In accordance with the present invention a deposited coating of anti-reflecting material is used on the entrance surface.

BRIEF DESCRIPTION OF THE DRAWINGS

The objects advantages and novel features of the invention will be more fully apparent from the following detailed description when read in connection with the accompanying drawings wherein.

BEST MODE FOR CARRYING OUT THE INVENTION

Figure 1:
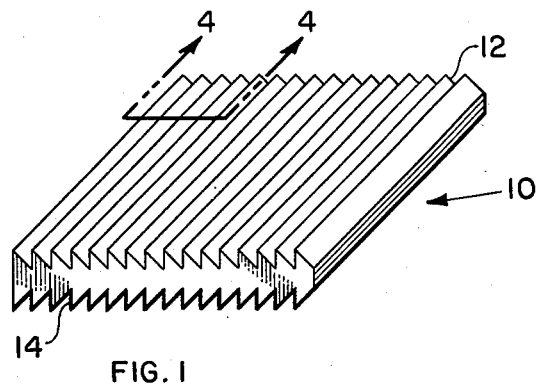
FIG. 1 is a perspective view of a solar cell having a rectangular configuration embodying the features of the present invention.

Referring now to the drawings, there is shown in FIG. 1 a photovoltaic device comprising a solar cell 10 in the form of a semiconductor substrate having a top or front surface with a plurality of parallel grooves 12 that are substantially uniform. The solar cell 10 also has a bottom surface with a plurality of similar parallel grooves 14.

Figure 2:
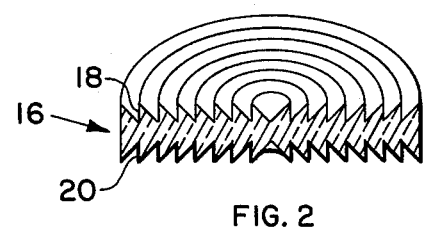
FIG. 2 is a vertical section of a perspective view of a solar cell having a circular configuration embodying the features of the present invention.

FIG. 2 shows another embodiment of the photovoltaic device comprising a solar cell 16 made from a circular wafer of semiconductor substrate material. The wafer 16 has a top or front surface containing concentric grooves 18. The bottom or back surface of the wafer 16 likewise contains a plurality of concentric grooves 20. The solar cells shown in both FIGS. 1 and 2 are particularly useful at very high levels of insolation because the infrared or heat radiation passes through the cells 10 and 16 without being appreciably absorbed to heat the cell.

Figure 3:
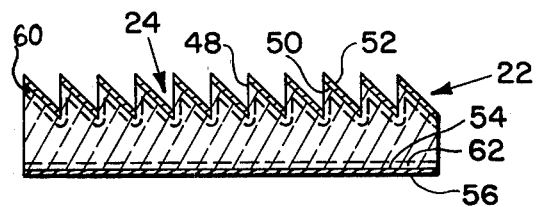
FIG. 3 is a vertical section view through a solar cell illustrating an alternate embodiment of the invention wherein the bottom surface has a flat configuration.

In the embodiment shown in FIG. 3 a solar cell 22 has a bottom mirror configuration wherein heat is returned through top reflectors to outside the cell. The solar cell 22 likewise has a plurality of parallel grooves 24 in its top or front surface.

Figure 4:
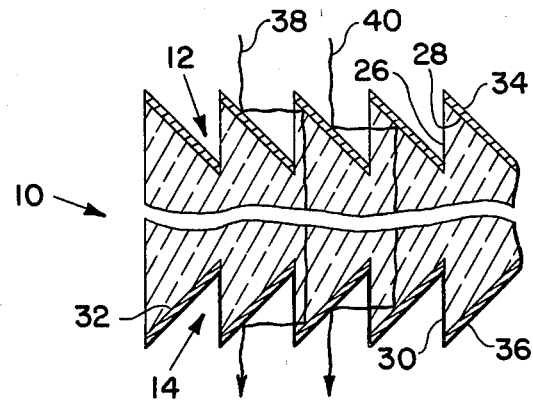
FIG. 4 is an enlarged section view taken along the lines 4—4 in FIG. 1 showing long-wave light paths through the solar cell.

Referring to FIG. 4, each groove 12 on the top or front surface of the solar cell 10 has a vertical face 26 that is normal to the top surface and a mirror face 28 at an angle of about 45° thereto. Likewise, each groove 14 in the back or bottom surface has a vertical face 30 that is normal to the back surface and a mirror face 32 extending at an angle of about 45° thereto.

Each angularly disposed mirror face 28 is covered with a coating of reflecting material 34 while the bottom mirror face 32 is covered with a reflecting coating 36. The reflecting coating 34 on the top surface comprises a silver layer that is vacuum-deposited on the angularly disposed mirror face 28. The back reflecting coating 34 is formed by a layer of silver that is vacuum-deposited over a layer of aluminum that is likewise vacuum-deposited onto the slanted mirror face 32.

A long wave light ray 38 striking the top or front surface of the solar cell 10 is reflected from the outwardly facing surface of the reflecting metal 34. This entering light ray 38 is directed through the vertical face 26 to the adjacent angularly disposed mirror face 28 whereupon it is reflected from the inwardly facing surface of the reflecting metal coating 34.

This entering long wave light ray then passes completely through the solar cell 10 to emerge from the opposite surface. This emerging light ray strikes the angularly disposed mirror face 32 on the bottom side of the solar cell. The emerging light ray 38 is then reflected from the inwardly facing surface of the reflecting metal coating 36 whereupon it leaves the solar cell 10 through the vertical face 30. The emerging light ray 38 then strikes the outwardly facing surface of the reflecting metal coating 36 whereupon it is directed away from the solar cell 10. A similar path is traveled by an adjacent long wave light ray 40 as shown in FIG. 4.

Figure 5:
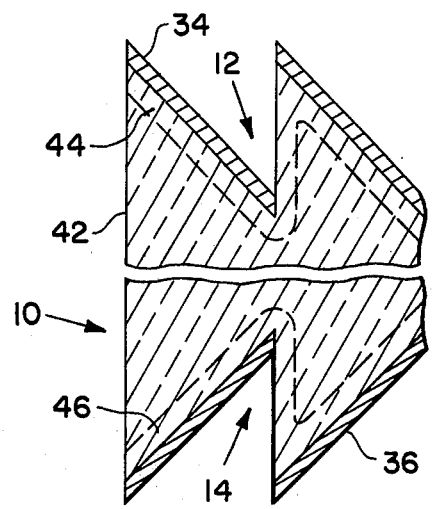
FIG. 5 is an enlarged view of a portion of the solar cell shown in FIG. 4 illustrating various structural features of the invention.

Referring to FIG. 5 the solar cell 10 is made from a silicon wafer having a p-doped bulk region 42. A diffused or implanted junction n doped region 44 is diffused into the wafer adjacent to the grooves 12. A similar back surface field region is formed by a diffused or implanted junction p+-doped region 46 that is formed in the wafer on the back surface adjacent to the grooves 14.

Referring again to the embodiment shown in FIG. 3, each groove 24 has a vertical face 48 and an angularly disposed mirror face 50 covered by a reflecting coating 52. A substantially planar back or bottom surface 54 is covered by a reflecting metal coating 56 which may be a layer of silver vacuum-deposited thereon.

Figure 6:
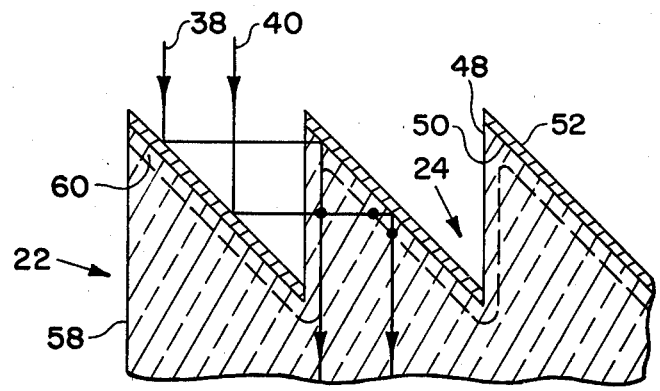
FIG. 6 is an enlarged view of a portion of the solar cell illustrated in FIG. 3 showing several light paths through the solar cell.

As shown in more detail in FIG. 6 the solar cell 22 of FIG. 3 comprises a silicon wafer having a p-doped bulk region 58. An n-doped region 60 is diffused or implanted into the front or upper surface adjacent to the grooves 24 to form a junction adjacent to the front surface field region. A similar p+-doped region 62 is diffused or implanted into the back or bottom surface of the solar cell 22 to form a junction at the back surface field region as shown in FIG. 3. The depth of the grooves 12,14,18,20,24 in each of the embodiments is preferably between 1 to 10 micrometers. The depth of the junctions 44,46,60 and 62 is preferably between 0.1 to 2.0 micrometers.

Referring again to FIG. 6 the paths of the two light rays 38 and 40 are shown entering the solar cell and traversing the active junction regions. The ray 38, entering the solar cell 22 near the top edge of one of the saw tooths, is reflected from the inwardly facing surface of the reflecting metal coating 52 and passes downward into the solar cell bulk in a grazing path along the semiconductor junction formed between regions 58 and 60. The probability of photon absorption and carrier collection, particularly for shorter wavelength light, is great in such a path.

The ray 40, which is shown entering at the approximate center of the groove 24, repeatedly traverses the junction 60 at least at the three nodal points shown in FIG. 6. This enhances the absorption and collection of the light ray 40.

Similar conditions apply for the emerging light reaching the back surface field regions 62 in FIG. 3 and 46 in FIG. 5 which are actually second semiconductor junction regions. In the embodiment shown in FIGS. 1,4, and 5 the emerging light ray 40 again repeatedly traverses the junction 46 at least at three nodal points. In the embodiment shown in FIG. 3 the light ray traverses the junction region 62 as it passes to the planar surface 54. This light ray again traverses junction region 62 as it is reflected back toward the grooves 24 by the reflecting metal coating 36.

Figure 7:
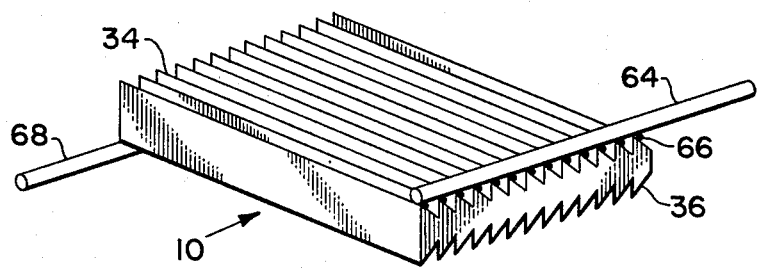
FIG. 7 is a perspective view showing the structure for collecting the current from the solar cell shown in FIGS. 1 to 3.

The structure utilized to collect the current from the saw toothed edges of the grooved surfaces on each solar cell is shown in FIG. 7. In this embodiment the top edges of the reflecting metal layers are connected to an electrically conducting wire 64 by solder fillets 66. While each collecting layer 34 preferably is of the type shown in FIG. 4, metal films such as those shown at 52 in FIG. 3 also may be used.

In a like manner a similar wire 68 is connected by solder fillets to the bottom edges of the reflecting metal layers 36. Although the bottom wire 66 is shown connected to the end of the solar cell 10 that is opposite the top wire 64, it will be appreciated that it may be advantageous to have the wires 64 and 66 positioned one above the other to lessen the cell area lost to light transmissions.

Obviously, numerous additional modifications and variations of the present invention are possible in light of the above teachings. By way of example, it will be recognized by those skilled in the art that refraction effects within the body of the semiconductor solar cell may have to be taken into account in the design of working devices of different semiconductors. It is, therefore, to be understood that within the scope of the appended claims the invention may be practiced otherwise than as specifically described herein.

What is claimed is:

1. A heat transparent high intensity solar cell having improved efficiency comprising
    a semiconductor substrate having a plurality of grooves on at least one surface thereof, each of said grooves having a first face substantially normal to said surface and a second face angularly disposed to said first surface,
    a photovoltaic junction in said substrate adjacent to said grooves, said junction having one portion in substantial juxtaposition with said first face and another portion in substantial juxtaposition with said second face, and
    reflecting means adjacent to said second face of each groove, said reflecting means including
    a first mirror surface for directing entering light rays into said solar cell through said first face to traverse said one portion of said junction, and for directing emerging light rays from said first face of said groove away from said solar cell after traversing said one portion of said junction, and
    a second mirror surface oppositely disposed from said first mirror surface for directing said entering light rays toward an opposite surface of said solar cell whereby said entering light rays repeatedly traverse said other portion of said junction, and for directing said emerging light rays toward said first face whereby said emerging light rays repeatedly traverse said other portion of said junction.

2. A solar cell as claimed in claim 1 wherein the reflecting means comprises a coating of a reflecting material on said second face of each groove, said coating having
    an outwardly facing mirror surface for directing entering light rays toward said first face of said groove, and for directing emerging light rays from said first face away from said solar cell, and
    an inwardly facing mirror surface covering said second face for directing said light rays back through said other portion of said junction.

3. A solar cell as claimed in claim 2 wherein the coating comprises a metal.

4. A solar cell as claimed in claim 3 wherein the metal coating comprises a layer of silver.

5. A solar cell as claimed in claim 3 wherein the metal coating comprises a layer of silver over a layer of aluminum.

6. A solar cell as claimed in claim 1 wherein the grooves are contiguous.

7. A solar cell as claimed in claim 6 wherein the substrate comprises a rectangular wafer and the grooves are parallel.

8. A solar cell as claimed in claim 6 wherein the substrate comprises a circular wafer and the grooves are concentric.

9. A solar cell as claimed in claim 1 wherein the second face of each groove extends from the first face at an angle of about 45°.

10. A solar cell as claimed in claim 1 including a plurality of grooves in another surface of the substrate opposite said one surface, each of said grooves having one face substantially normal to said other surface and another face with reflecting means adjacent thereto angularly disposed to said one face, and another photovoltaic junction in said substrate adjacent to said grooves in said other surface whereby the emerging light rays directed by the reflecting means adjacent to the second face of a groove in said one surface traverses said other photovoltaic junction repeatedly before passing through said one face to said other face and being directed away from said solar cell by the reflecting means adjacent to the other face of an adjacent groove.

11. A solar cell as claimed in claim 10 wherein the second face of each of the grooves in both surfaces of the photovoltaic substrate is covered with a metal reflecting coating, and said metal coatings are in electrical communication with current collecting means, said means comprising a first electrically conducting member in contact with said metal coating on the second face of each groove in the one surface of the substrate, and a second electrically conducting member in contact with said metal coating on the second face of each groove in the other surface of the substrate.

12. A solar cell as claimed in claim 11 wherein the electrically conducting members are wires, one of said wires being electrically connected to the outermost edge of the metal coating on each second face along one end of said substrate, and the other of said wires being electrically connected to the outermost edge of the metal coating on each second face of each groove in the other surface along the opposite end of said substrate.

13. A solar cell as claimed in claim 1 wherein the photovoltaic substrate has a substantially planar surface oppositely disposed from the one surface thereof having the grooves therein, and a photovoltaic voltaic junction in said substrate adjacent to said planar surface, and a coating of a reflecting metal on said planar surface.

14. A solar cell as claimed in claim 13 wherein the reflecting metal coating is silver.

15. A solar cell as claimed in claim 1 wherein the grooves are substantially uniform and have a depth between about 1 and 10 micrometers.

16. A solar cell as claimed in claim 15 wherein the depth of the photovoltaic junction is between about 0.1 and 2.0 micrometers from the faces of the grooves.

17. A solar cell as claimed in claim 1 wherein the photovoltaic substrate comprises a p-doped bulk region, an n-doped region adjacent to the one surface having the grooves therein, and a p+-doped region adjacent to another surface opposite said one surface.

* * * * *